United States Patent
Rosenberg et al.

(10) Patent No.: US 11,048,030 B2
(45) Date of Patent: Jun. 29, 2021

(54) SPECTRALLY SELECTIVE PANEL

(71) Applicant: TROPIGLAS TECHNOLOGIES LTD, Yokine (AU)

(72) Inventors: Victor Rosenberg, Yokine (AU);
Mikhail Vasiliev, Quinns Rocks (AU);
Kamal Alameh, Rivervale (AU)

(73) Assignee: TROPIGLAS TECHNOLOGIES LTD, Yokine (AU)

( * ) Notice: Subject to any disclaimer, the term of this patent is extended or adjusted under 35 U.S.C. 154(b) by 969 days.

(21) Appl. No.: 14/145,987

(22) Filed: Jan. 1, 2014

(65) Prior Publication Data

US 2014/0182676 A1 Jul. 3, 2014

Related U.S. Application Data

(63) Continuation of application No. PCT/AU2012/000787, filed on Jun. 29, 2012.

(30) Foreign Application Priority Data

Jul. 1, 2011 (AU) ................................ 2011902631
Nov. 2, 2011 (AU) ................................ 2011904552
(Continued)

(51) Int. Cl.
*G02B 5/28* (2006.01)
*H01L 31/055* (2014.01)
(Continued)

(52) U.S. Cl.
CPC ........ *G02B 5/282* (2013.01); *B32B 17/10036* (2013.01); *B32B 17/10669* (2013.01);
(Continued)

(58) Field of Classification Search
CPC ......... H02S 40/22; G02B 5/282; G02B 5/283; G02B 5/1814; G02B 5/208; H01L 31/0547; H01L 31/055; E06B 9/24
See application file for complete search history.

(56) References Cited

U.S. PATENT DOCUMENTS 3,247,392 A * 4/1966 Thelen ................ C03C 17/3452
136/257
6,285,495 B1 9/2001 Baranov et al.
(Continued)

FOREIGN PATENT DOCUMENTS

AU 2007231811 5/2009
EP 2103967 9/2009
(Continued)

OTHER PUBLICATIONS

Gottschlag "Experimental study of variations of the solar spectrum of relevance to thin film solar cells", Solar Energy Materials & Solar Cells 79 (2003) 527-537.*
(Continued)

*Primary Examiner* — Devina Pillay
(74) *Attorney, Agent, or Firm* — Michael Best & Friedrich LLP

(57) ABSTRACT

The present disclosure provides a spectrally selective panel that comprises a first panel portion that is at least partially transmissive for light having a wavelength in the visible wavelength range. The panel also comprises a first reflective component that is arranged to reflect incident light within an infrared (IR) wavelength band and within an ultraviolet (UV) wavelength band while being at least partially transmissive for light having a wavelength within the visible wavelength band.

12 Claims, 8 Drawing Sheets

(30) Foreign Application Priority Data

Feb. 2, 2012 (AU) ................................ 2012900381
Apr. 24, 2012 (AU) ................................ 2012901618

(51) Int. Cl.

| | | |
|---|---|---|
| *H01L 31/054* | (2014.01) | |
| *H02S 20/26* | (2014.01) | |
| *H02S 40/22* | (2014.01) | |
| *B32B 17/10* | (2006.01) | |
| *E06B 9/24* | (2006.01) | |
| *G02B 5/20* | (2006.01) | |
| *G02B 5/18* | (2006.01) | |

(52) U.S. Cl.
CPC .......... *B32B 17/10761* (2013.01); *E06B 9/24* (2013.01); *G02B 5/1814* (2013.01); *G02B 5/208* (2013.01); *H01L 31/055* (2013.01); *H01L 31/0547* (2014.12); *H01L 31/0549* (2014.12); *H02S 20/26* (2014.12); *H02S 40/22* (2014.12); *E06B 2009/2417* (2013.01); *E06B 2009/2476* (2013.01); *Y02B 10/10* (2013.01); *Y02E 10/52* (2013.01)

(56) References Cited

U.S. PATENT DOCUMENTS

| | | | |
|---|---|---|---|
| 2006/0154089 A1* | 7/2006 | Jung | ................ B32B 17/10036 |
| | | | 428/432 |
| 2006/0198025 A1* | 9/2006 | Chen | ...................... G02B 5/288 |
| | | | 359/588 |
| 2008/0223438 A1 | 9/2008 | Xiang et al. | |
| 2009/0032083 A1 | 2/2009 | Torrance et al. | |
| 2009/0283144 A1* | 11/2009 | Hebrink | ................ G02B 1/105 |
| | | | 136/259 |
| 2010/0224248 A1* | 9/2010 | Kenney | ................ H01L 31/055 |
| | | | 136/259 |
| 2011/0100449 A1* | 5/2011 | Yang | .................... H01G 9/2027 |
| | | | 136/256 |
| 2011/0134515 A1 | 6/2011 | Banerjee et al. | |
| 2012/0055564 A1* | 3/2012 | Gravisse | ............... H01L 31/055 |
| | | | 137/257 |
| 2012/0138144 A1* | 6/2012 | Maeda | ................. H01L 31/055 |
| | | | 136/257 |

FOREIGN PATENT DOCUMENTS

| | | | | |
|---|---|---|---|---|
| JP | H01273006 | 10/1989 | | |
| JP | H11281816 | 10/1995 | | |
| JP | 2001510902 | 8/2001 | | |
| JP | 2003043245 | 2/2003 | | |
| JP | 2007183525 | 7/2007 | | |
| WO | 2006116567 | 11/2006 | | |
| WO | 2007035466 | 3/2007 | | |
| WO | 2006117979 | 11/2009 | | |
| WO | WO 2010092159 A2 * | 8/2010 | ........... H01L 31/055 |
| WO | 2010124279 | 10/2010 | | |
| WO | WO-2011061987 A1 * | 5/2011 | ........... H01L 31/055 |

OTHER PUBLICATIONS

Extended European Search Report for Application No. 12807656.9 dated Jan. 9, 2015 (9 pages).
International Report on Patentability for International Application No. PCT/AU2012/000787 dated Oct. 14, 2013 (51 pages).
International Search Report for International Application No. PCT/AU2012/000787 completed Aug. 29, 2012 (5 pages).
Patent Examination Report No. 1 for AU Application No. 201278920 dated Sep. 11, 2015 (5 pages).
European Patent Office Action for Application No. 12807656.9 dated Feb. 20, 2017 (5 pages).

* cited by examiner

SPECTRALLY SELECTIVE PANEL

CROSS-REFERENCE TO RELATED APPLICATIONS

This application is a continuation of and claims priority to International Patent Application No. PCT/AU2012/000787 filed Jun. 29, 2012, the entire content of which is hereby fully incorporated by reference. This application also claims priority to Australian Patent Application Nos. 2011902631 filed Jul. 1, 2011, 2011904552 filed Nov. 2, 2011, 2012900381 filed Feb. 2, 2012, and 2012901618 filed Apr. 24, 2012, the entire content of each of which is hereby fully incorporated by reference.

FIELD OF THE INVENTION

The present invention relates to a spectrally selective panel and relates specifically, though not exclusively, to a panel that is transparent for visible light and diverts infrared light.

BACKGROUND OF THE INVENTION

Overheating of interior spaces, such as spaces that receive sunlight through large windows, is a problem that may be overcome using air conditioners. A large amount of energy is globally used to cool interior spaces. The majority of electrical energy is generated using non sustainable sources, which is of increasing environmental concern.

U.S. Pat. No. 6,285,495 (owned by the present applicant) discloses a material that may be used as a windowpane and that is largely transmissive for visible light, but diverts a portion of incident light to side portions of the panel where it is absorbed by photovoltaic cells to generate electricity. This material is of dual benefit: As the transmission of IR radiation is reduced, heating of interior spaces can be reduced and at the same time electrical energy can be generated.

SUMMARY OF THE INVENTION

The present invention provides in a first aspect a spectrally selective panel comprising:
  a first panel portion that is at least partially transmissive for light having a wavelength in the visible wavelength range; and
  a first reflective component that is arranged to reflect incident light within an infrared (IR) wavelength band and within an ultraviolet (UV) wavelength band while being at least partially transmissive for light having a wavelength within the visible wavelength band, the first reflective component being arranged to reflect more than 90% of the incident radiation at a wavelengths range from approximately 300 nm to approximately 420 nm.

The first reflective component typically is arranged to reflect more than 92%, more than 94%, more than 96% or more than 98% of the incident radiation at a wavelength range from approximately 300 nm to approximately 420 nm.

The present invention provides in a second aspect a spectrally selective panel comprising:
  a first panel portion that is at least partially transmissive for light having a wavelength in the visible wavelength range; and
  a first reflective component that is arranged to reflect incident light within an infrared (IR) wavelength band and within an ultraviolet (UV) wavelength band while being largely transmissive for at least the majority of light having a wavelength within the visible wavelength band, the first reflective component being arranged such that within a wavelengths range from approximately 380 nm to approximately 420 nm the transmittance increases from less than 10% to more than 60%.

The first reflective component typically is arranged such that within a wavelengths range from approximately 380 nm to approximately 420 nm the transmittance increases from less than 5% to more than 80%.

The present invention provides in a third aspect a spectrally selective panel comprising:
  a first panel portion that is at least partially transmissive for light having a wavelength in the visible wavelength range; and
  a first reflective component that is arranged to reflect incident light within an infrared (IR) wavelength band and within an ultraviolet (UV) wavelength band while being arranged such that more than 40%, 50%, 60%, 70%, 80% or 90% of incident light is transmitted within a wavelengths range of approximately 400 nm to approximately 680-750 nm.

The present invention provides in a fourth aspect a spectrally selective panel comprising:
  a first panel portion that is at least partially transmissive for light having a wavelength in the visible wavelength range; and
  a first reflective component that is arranged to reflect incident light within an infrared (IR) wavelength band and within an ultraviolet (UV) wavelength band while being largely transmissive for at least the majority of light having a wavelength within the visible wavelength band, the first reflective component being arranged such that within a wavelengths range from approximately 600 nm to approximately 800 nm the transmittance decreases from at least 60% to less than 10%.

The first reflective component of the fourth aspect typically is arranged such that within a wavelengths range of from approximately 600 nm to approximately 800 nm the transmittance decreases from at least 80% to less than 5%.

The spectrally selective panel according to the fourth aspect typically is also arranged such that within a wavelengths range from approximately 380 nm to approximately 420 nm the transmittance increases from less than 5%-10% to more than 60-80%.

The spectrally selective panel according to the fourth aspect may also be arranged to reflect more than 90%, more than 92%, more than 94%, more than 96% or more than 98% of the incident radiation at a wavelength a wavelengths range of approximately 300 to approximately 410 nm.

The present invention provides in a fifth aspect a spectrally selective panel comprising:
  a first panel portion that is at least partially transmissive for light having a wavelength in the visible wavelength range; and
  a first reflective component that is arranged to reflect incident light within an infrared (IR) wavelength band and within an ultraviolet (UV) wavelength band while being largely transmissive for at least the majority of light having a wavelength within the visible wavelength band, the first reflective component being arranged to reflect more than 90% of solar energy of the incident radiation at a wavelengths range of approximately 700 nm to approximately 1700 nm.

The first reflective component typically is arranged to reflect more than 92%, more than 94%, more than 96% or more than 98% of solar energy of the incident radiation at a wavelengths range of approximately 700 nm to approximately 1700 nm.

The present invention provides in a sixth aspect a spectrally selective panel comprising:
a first panel portion that is at least partially transmissive for light having a wavelength in the visible wavelength range; and
a first reflective component that is arranged to reflect incident light within an infrared (IR) wavelength band and within an ultraviolet (UV) wavelength band while being largely transmissive for at least the majority of light having a wavelength within the visible wavelength band, the first reflective component comprising exclusively dielectric materials.

The following description relates to the first, second, third, fourth fifth and sixth aspects of the present invention.

The first spectrally selective component typically is provided in the form of a multiple stack edge mirror that comprises layers of dielectric materials that are arranged to reflect incident light within an infrared (IR) wavelength band and within an ultraviolet (UV) wavelength band while being largely transmissive for at least the majority of light having a wavelength within the visible wavelength band in a manner as defined in any one of the first to sixth aspect of the present invention.

The spectrally selective panel typically is arranged such that at least a portion of an energy associated with IR light incident from a transversal direction of the spectrally selective panel is reflected by the first reflective component and subsequently directed along the panel towards a side portion of the panel.

The spectrally selective panel may be used for various purposes. For example, the spectrally selective panel may be provided in the form of, or may comprise, a windowpane of a building, car, boat or any other object that comprises windows or blinds. Further, the spectrally selective panel may form a covering of an object.

The first reflective component typically is a film such as an optical interference coating that may be attached to, or deposited onto, the first panel portion, which for example may be provided in the form of a glass panel portion or may be formed from a polymeric material that may be flexible.

The spectrally selective panel typically also comprises a luminescent material arranged to absorb at least a portion of incident and/or reflected light having a wavelength in the IR wavelength band and emit light by luminescence.

The spectrally selective panel may be arranged such that IR light incident from a transversal direction within a plurality of spatial angles (adding up to 2*Pi steradians) within a light incidence semi-space is reflected by the first reflective component.

In one specific embodiment of the present invention the first reflective component is provided in the form of a reflective layer that typically comprises a layered structure. The layered structure typically is an optical interference structure such as a triple-stack edge filter comprising at least two, typically three stacks of respective material layers that may for example comprise $Al_2O_3$, $SiO_2$ or $Ta_2O_5$. In one embodiment the layered structure functions as short-wavelength pass filter and also a heat mirror. The layer typically has anti-reflective properties for at least the majority or even the entire wavelength range of the visible light.

The first panel portion may comprise two or more component panel portions, such as glass panel portions, that may be coupled together in a face-to-face relationship. The component panel portions may be coupled together using a suitable adhesive.

In one specific embodiment the spectrally selective panel comprises a second reflective component that is arranged to reflect at least a portion of radiation having a wavelength in an IR wavelength range, such as in a wavelength range of thermal IR radiation. The second reflective component may be arranged to reflect at least a portion, typically the majority, of radiation having a wavelength in the range of 1500 nm to 5000 nm, 1500 nm to 10000 nm, 1500 to 20000 nm. The second reflective component typically is arranged such that transmission of radiation having a wavelength in the range of 750 nm to 1300 nm, 750 to 1400 nm, or 750 nm to 1500 nm is 50%, 70%, 80% or even 90% greater than transmission of radiation having a wavelength of the order of 1500 nm to 2000 nm, 1600 nm to 5000 nm or 1700 nm to 5000 nm. In one specific embodiment the second reflective component is arranged such that transmission of at least the majority of radiation having a wavelength within the range of 1600 nm to 10000 nm, 1700 nm to 10000 nm or 1800 nm to 10000 nm has an intensity that is reduced 20%, 15%, 10%, 5%, 3%, 2% or even 1% of the incident radiation.

The second reflective component typically is provided in the form of a film such as an optical interference coating that may be attached to, or deposited onto, the first panel portion.

The second reflective component typically is arranged such that at least a portion, typically the majority, of energy associated with thermal IR radiation, such as thermal IR radiation that is incident form an interior space adjacent the spectrally selective component, is reflected and at least a portion, typically the majority, of incident solar light within an IR wavelength band is allowed to transmit through the second reflective component. As described above, the first reflective component typically is arranged to reflect incident solar light within an IR wavelength band and within an UV wavelength band while being at least partially transmissive for light having a wavelength within the visible wavelength band. The spectrally selective component typically is in use positioned such that incident solar light is first passing through the second reflective component before passing through the first reflective component. Further, the spectrally selective component typically is in use positioned such that thermal IR radiation, such as thermal IR radiation form an interior space adjacent the spectrally selective component, is first passing through the first reflective component before passing through the second reflective component. The combination of the first reflective component with the second reflective component in accordance with a specific embodiment of the present invention combines the thermal insulating properties offered by the second reflective component with solar selective properties of the first reflective component.

The first and second reflective components typically are attached to, or deposited on, opposite sides of the first panel portion. Alternatively, the first panel portion may comprise two or more component panel portions and the second reflective component may be attached to another component panel portion than the first reflective component. For example, the spectrally selective panel may be arranged such that the first reflective component faces an interior space (such as an interior space of a building) and the second reflective component is located at a position that is spaced apart from the interior space and the first reflective component.

The spectrally selective panel typically also comprises a scattering material that is arranged to increase scattering of incident light, such as a scattering material that predominantly scatters light having a wavelength in the IR wavelength range. For example, the scattering material may comprise micro- or nano-sized particles and may be provided in the form of a film. Alternatively, the scattering material may be dispersed within the first panel portion, or within the adhesive that couples two panel portions. Scattering of light may be achieved in a substantially lossless (non-absorbing) manner within the IR and/or visible wavelength range if for example scattering materials are used that have relatively wide energy band-gaps, such as particles of rare earth oxides ($Yb_2O_3$ or $Nd_2O_3$ for example).

In one specific embodiment the first panel portion comprises component panel portions and the scattering material is sandwiched between adjacent ones of the component panel portions that are positioned in a face-to-face relationship. In this embodiment the scattering material may also comprise the luminescent material and may function as an adhesive that couples the component panel portions together in a face-to-face relationship.

The spectrally selective panel may also comprise a gap between component panel portions, which may be spaced apart using suitable spacers. The gap typically is filled with a fluid such as air or another suitable gaseous material or a suitable liquid. For example, surfaces of the component panel portions defining the gap may be coated with the scattering material and/or the luminescent material. The surfaces of the component panel portions may also comprise optical diffractive elements.

In one specific example the scattering material is arranged for preferential scattering of IR light while at least the majority of incident visible light largely transmits through the scattering material. The scattering material may comprise a layered structure having a plurality of layers and one or more of the layers may have an amorphous structure. The scattering material may further comprise composite materials in which nano- or micro-crystals are surrounded by an amorphous-material matrix.

Further, the scattering material may comprise optical elements such as diffractive elements or phase masks (optical phase gratings) that result in scattering and/or directional deflection of incident and/or reflected light.

The spectrally selective panel typically is arranged such that the first reflective component, which typically is a reflective layer, is positioned at a bottom portion of the spectrally selective panel and the first reflective component reflects a portion of IR light that is transmitted through the first panel portion.

Further, the spectrally selective panel may comprise a top layer on which light is incident prior to transmission through the first panel portion of the spectrally selective panel. The top layer typically is a multi-layered structure that is largely transmissive or even anti-reflective for visible light and arranged for reflecting a portion of IR light, such as IR light that is emitted by the luminescent material. The top layer may for example comprise oxide materials such as $Al_2O_3$, $SiO_2$ and $Ta_2O_5$.

In one specific embodiment the spectrally selective panel comprises at least one photovoltaic cell that is positioned at or near a side portion of the spectrally selective panel for receiving a portion of the IR and other light that is directed towards that side portion by the spectrally selective panel. For example, the at least one photovoltaic cell may be a Ge- or GaAs-based, or a CIGS (Copper Indium Gallium Diselenide), or CIS (Copper Indium Diselenide) photovoltaic cell that has a relatively small bandgap suitable for absorption of light in the IR wavelength range. Further, the at least one photovoltaic cell may comprise a stack of photovoltaic cells having multiple bandgaps.

The present invention provides in an eighth aspect a method of designing a spectrally selective panel, the method comprising the steps of:
  calculating properties of stacks of layers such that a layered structure having the stack of the layers is arranged to reflect incident light within an infrared (IR) wavelength band and within an ultraviolet (UV) wavelength band while being largely transmissive for at least the majority of light having a wavelength within the visible wavelength band, and
  forming the layered structure at or on a panel portion that is at least partially transmissive for light having a wavelength in the visible wavelength range.

The method typically is conducted such that the spectrally selective component is formed in accordance with any one of the first to seventh aspect of the present invention.

The invention will be more fully understood from the following description of specific embodiments of the invention. The description is provided with reference to the accompanying drawings.

DETAILED DESCRIPTION OF SPECIFIC EMBODIMENTS

Figure 1:
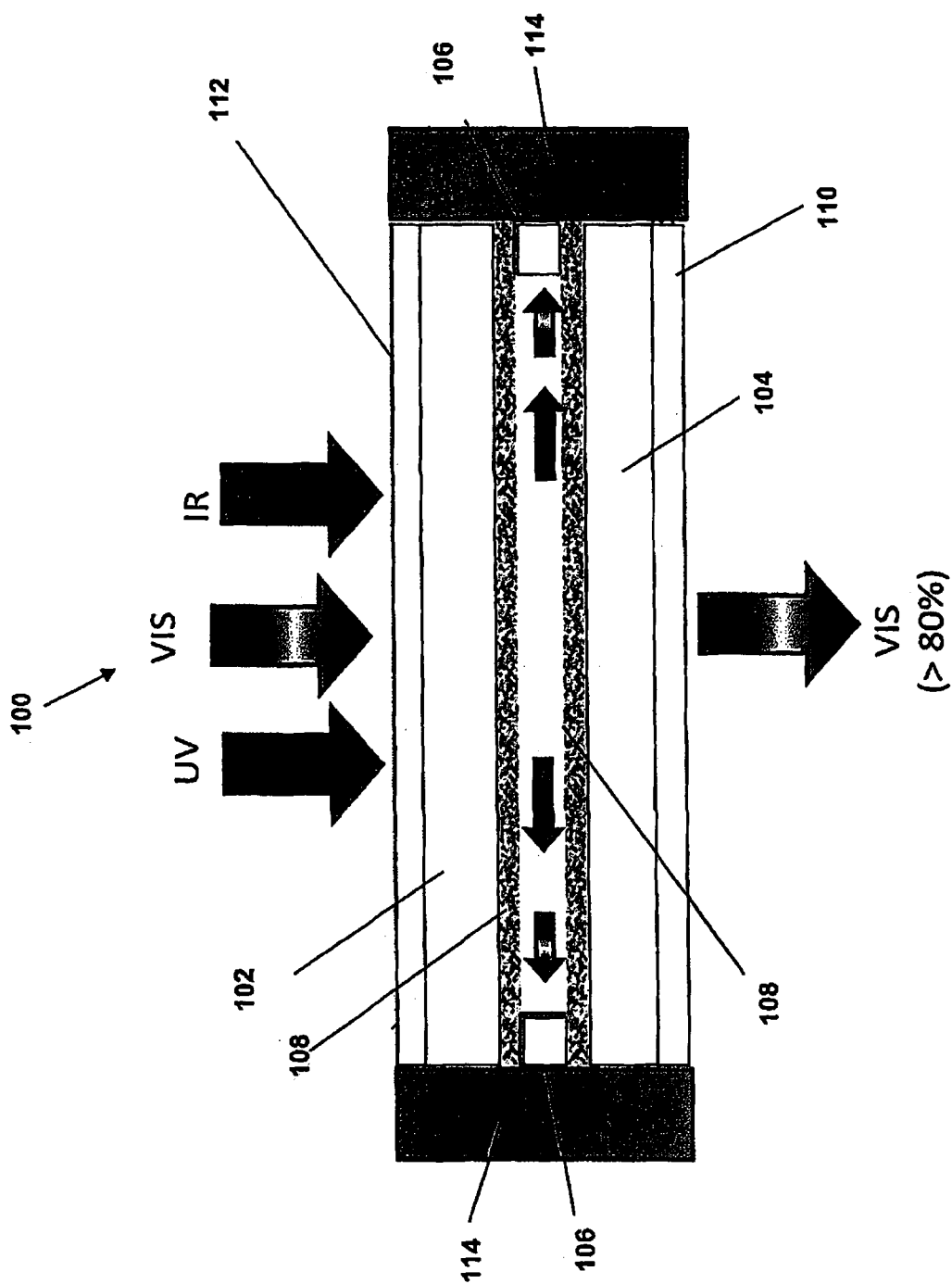
FIG. 1 is a representation of a spectrally selective panel in accordance with a specific embodiment of the present invention.

Referring initially to FIG. 1, a spectrally selective panel 100 is now described. The spectrally selective panel 100 may for example be provided in the form of a windowpane of a building, car, ship or any other suitable object. The spectrally selective panel reduces transmission of light having a wavelength in an IR wavelength band while being largely transmissive for visible light. In one embodiment the spectrally selective panel 100 is arranged to divert IR light and use the diverted IR light for generation of electrical energy.

The spectrally selective panel 100 comprises in this embodiment glass panels 102 and 104. The glass panels 102 and 104 are spaced apart by transparent glass spacer 106. Interior surfaces of the glass panels 102 and 104 are coated with coatings 108. Exterior surfaces of the panels 102 and 104 are coated with multilayer coatings 112 and 110, respectively. Solar cells 114 are positioned at side portions of the spectrally selective panel 100.

Further, the multilayer coating 110 is anti-reflective for visible light and reflective for incident UV light.

Consequently, a portion of IR and UV light that is incident from a top portion of the spectrally selective panel 100 is transmitted through the glass panels 102 and 104 and then reflected by the multilayer coating 110. The glass panels 102 and 104 are arranged such that, dependent on the angle of reflection, a portion of the reflected light is guided along the glass panels 102 and 104 towards solar cells 114, where the IR light can be absorbed for generating electrical energy.

Coatings 108 comprise in this embodiment nano- or micro-sized particles of rare earth oxides having a relatively wide energy bandgap such that scattering of suitable light is effectively lossless (non-absorbing). Consequently, the layers 108 function as scatters. Further, the layers 108 may comprise an epoxy that couples the glass panels 102 and 104 to the spacers 106.

The layers 108 also comprise luminescent materials and the above mentioned rare earth oxides are doped to have that function. For example, if light is incident from a transversal direction of the spectrally selective panel and then absorbed by the luminescent material, the subsequently emitted luminescent radiation is emitted in random directions. This results in radiation that is less transversely oriented and thus a significant portion of the emitted luminescent radiation will be emitted in such directions that the glass panels 102 and 104 will guide the luminescent radiation towards the solar cells 114 for generation of electrical energy.

The glass panels 102 and 104 may also be doped with luminescent materials that absorb a portion of the incoming IR and UV light and emit luminescent radiation in random directions.

Further, the layers 108 are arranged such that IR light is predominantly scattered, which will be discussed in detail further below. A portion of IR light that is reflected by the layer 110 in a transversal direction is scattered by the layers 108 such that corresponding light intensity is directed by multiple scattering and/or internal reflection towards the solar cells 114. Consequently, the scattering properties of the layers 108 facilitate reduction of throughput of IR radiation and improve the efficiency of energy generation.

The (optional) top coating 112 has anti-reflective properties in the UV and visible wavelength range and functions as an IR reflector. In another embodiment, the top coating 112 is arranged to be highly-reflective for the UV radiation whilst being antireflective for the visible light and optionally also highly-reflective within an IR wavelength (sub)-band within which the luminophore materials emit light. The antireflection property in the UV band is in this example used to protect the luminophores from being adversely affected by the incident UV radiation. This coating is a multi-layered structure that is designed to reflect IR light predominantly within the wavelength range at which the luminescent material emits light. Consequently, the coating 112 largely prevents that generated luminescent radiation escapes without being directed to the photovoltaic cells 114.

In this embodiment the gap between the glass panels 102 and 104 is filled with air. Similar to a double-glazing window structure, the gap provides thermal insulation, improved overall-structural stability, noise insulation and additional high-index-contrast interfaces which lead to improving the light trapping probability on multiple reflections within the glass panels due to total internal reflections.

It is to be appreciated that in alternative embodiments that gap may be filled with any other suitable dielectric material.

It will also be appreciated that in variations of the described embodiment the spectrally selective panel 100 may comprise any number of glass panels that may or may not define gaps between adjacent glass panels. Further, the glass panels may be replaced by panels of a suitable other material, such as a polymeric material including for example polyvinyl butyral (PVB) or polyvinyl chloride (PVC) and may also be provided in the form of a laminate such as a safety glass.

The luminescence material, in this example included provided in the layer 108, is located at top and bottom faces of the glass panels 102 and 104, respectively. Alternatively, the luminescent material may be positioned at only one of the glass panels 102 and 104 may be doped with, or may comprise, the luminescent material.

In addition, it is to be appreciated that in an alternative embodiment the spectrally selective panel 100 may not necessarily comprise photovoltaic cells 114, but may for example comprise vents, heat-sinks or the like that are arranged for removal of thermal energy that is directed in the form of IR radiation to side portions of the spectrally selective panel 100. Some of the side portions may also be coated by highly-reflective materials including Al or Ag or any suitable dielectric coatings which will re-direct the light away from such side surfaces towards other side-surfaces of the panel.

Figure 2:
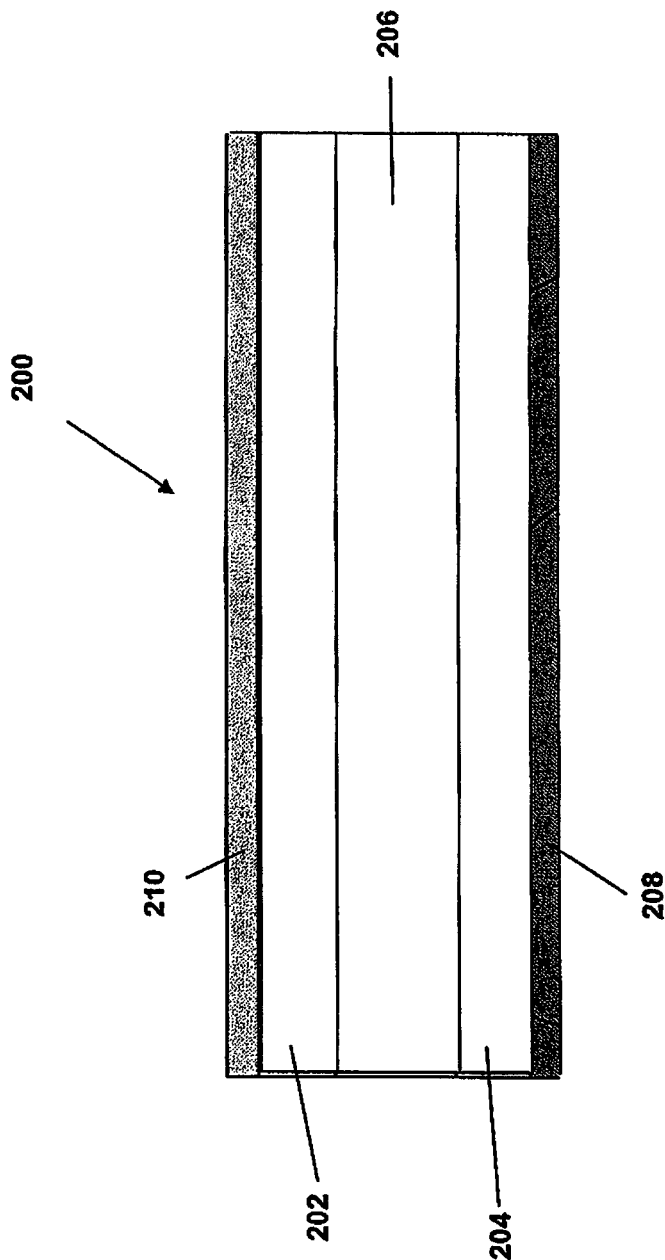
FIG. 2 is a representation of a spectrally selective panel in accordance with a further specific embodiment of a present invention.

Referring now to FIG. 2, a spectrally selective panel 200 in accordance with a further embodiment of the present invention is now described. The spectrally selective panel 200 comprises glass panels 202 and 204. In this embodiment, the glass panels are spaced apart by a layer 206 comprising an optical epoxy in which a luminescent scattering powder and pigments are dispersed. The luminescent scattering powder comprises a single material that is a composition and that provides luminescence and also the scattering functions. Alternatively, the luminescent scattering power may be a mixture of component materials and each component material may have a respective function. Consequently, the layer 206 combines the functions of coupling the glass panels 202 and 204 to each other, providing a luminescent material and acting as scattering layers. The spectrally selective panel 200 also comprises a bottom coating 208 that is reflective for IR radiation and has anti-reflective properties in the visible wavelengths range. The bottom coating 208 has properties that are analogous to those of the above-described coating 110. Further, the spectrally selective panel 200 also comprises a top coating that is in this example anti-reflective for visible and UV light, has a medium or moderate reflectivity for a first part of the near infra-red radiation and a high reflectivity for a second part of the near infra-red radiation wavelength band at which the luminescent material of the layer 206 emits luminescence light. Similar to the spectrally selective panel 100 shown in FIG. 1, the spectrally selective panel 200 may also comprise photovoltaic cells (not shown) positioned at side portions of the spectrally selective panel 200.

Further, the spectrally selective panel 100 or 200 comprises a diffractive optical element (not shown) that is arranged for spectrally-selective deflection of incident and reflected IR light. The diffractive optical element is operated as either reflection-mode or transmission-mode blazed diffraction gratings and is designed such that the majority of the incident solar IR light is deflected into a single preferential order of diffraction. Further, the diffractive optical element is arranged to allow transmission of visible light. The diffractive element is attached on a top face of the panel, but may in variations of the described embodiment also be located (or formed on) other faces of the panel 100 or 200 for example at surfaces that define a gap between two component panels. The spectral properties of the diffraction element can be designed by those skilled in the art by adjusting the following parameters: substrate's refractive index, grating profile shape, blaze angle, duty cycle, grating period, number of phase levels and etching depth(s).

The IR reflective layers 110 and 208 of the spectrally selective panels 100 and 200, respectively, will now be described in further detail.

The layers 110 and 208 are provided a in the form of multilayer optical interference coating filters that have ultra-broadband heat-mirror properties and use a triple-stack edge-filter coating design type. The layers 110 and 208 are also reflective in the UV range. The layers 110 and 208 are formed from $Al_2O_3$, $SiO_2$ and $Ta_2O_5$ using RF sputtering techniques. The total thickness of such a coating is in this embodiment between 4-8 µm and the order of optical materials within a sequence of layers may vary, depending on a chosen design. Annealing experiments (3 hrs at 600° C. with temperature ramp-rates of 5° C./min) demonstrated excellent mechanical, stress-exposure related, thermal exposure-related and adhesion stability of our coatings. The layers 110 and 208 are scratch- and crack-resistant, heat-resistant, non-hygroscopic and stable with respect to the action of common chemical solvent types.

The performance characteristics of the coatings of the type 110 and 208 on glass were tested and modelled. Results indicated that the fraction of total integrated solar-IR light power contained within the wavelength range of 700-1700 nm and that transmits optically through the substrate-coating system is only approximately 4%. Since the coatings 110 and 208 have ultra-wideband properties, IR power reflectivity is efficient for a wide range of incident angles.

In one embodiment of the present invention the coatings of the type of 110 and 208 are provided on transparent film or flexible transparent substrates (not shown) that also have an adhesive coating. In this embodiment the films provide effectively (portable) IR mirrors that can be applied to objects. A person skilled will appreciate that various types of foils and adhesive materials may be used for this purpose.

The coating 110 will now be described in further detail. The coating 110 is a multilayer coating and is arranged to reflect incident IR light within a wide IR wavelength band. The coating 110 has in this embodiment also a relatively high reflectivity (>90% or even >98%) of solar light across a wide (controlled-width) UV band of solar radiation within the general limits between 300-410 nm. Further, the coating 110 has a rather steep spectral transmission response slope near approximately 400 nm, such that the light transmission raises from near-zero (sub 5%) level for the wavelengths just below 400-415 nm, to a significant optical transmission level exceeding 60-80% already within the adjacent violet light region near 400-420 nm. The steepness of this slope is defined as percentage of transmittance (T) change per nanometer bandwidth. The coating 110 has a UV-to-visible transmission-slope tangent of 8-10% T/nm, with the UV-to-visible transmission slopes positioned in the vicinity of 400 nm.

The coating 110 also has a spectrally-flat transmissive properties in the visible spectral region contained within 380-750 nm. The "stability" of the visible transmission response region can be described by the ratio between the 80% T-level bandwidth (in nm) of the transmitted radiation band to the full width at half maximum bandwidth of the same transmission band. The coating 110 typically has a response stability in excess of 0.9.

The coating 110 is also arranged to have a steep spectral transmission response slope near approximately 700+/−100 nm, such that the transmittance decreases from the level within the visible band (typically over 60-80%) level for the wavelengths above 400+/−20 nm, but below 700+/−100 nm to a rather small optical transmission level not exceeding 5-10% already within the adjacent red or near-IR light region near the vicinity of 700 nm where the significant transmission change is engineered to occur. This loss of transmission that within the wavelength range just above the visible-band in wavelength, is engineered to occur due to the increased reflectivity of light by the coating-glass substrate system, rather than being due to any increase in the optical absorbance within that wavelength region.

The steepness of this spectral transmission-reduction slope can be characterised by the percentage of transmittance change per nanometer bandwidth. The coating 110 is arranged such that the visible light band to the near-infrared solar light slope tangents is about −2.5-(−3) % T/nm with the visible-to-IR transmission response slopes typically positioned spectrally in the vicinity of either 700 nm (+/−20 nm) or 750 nm (+/−20 nm).

The coating 110 also has a spectrally-broad (in excess of 200-300 nm) high-reflectivity region within the solar IR spectral region of solar radiation immediately following (on the high-wavelength side of spectrum) the previously-described visible-to-IR transmission response slope.

Figure 5:
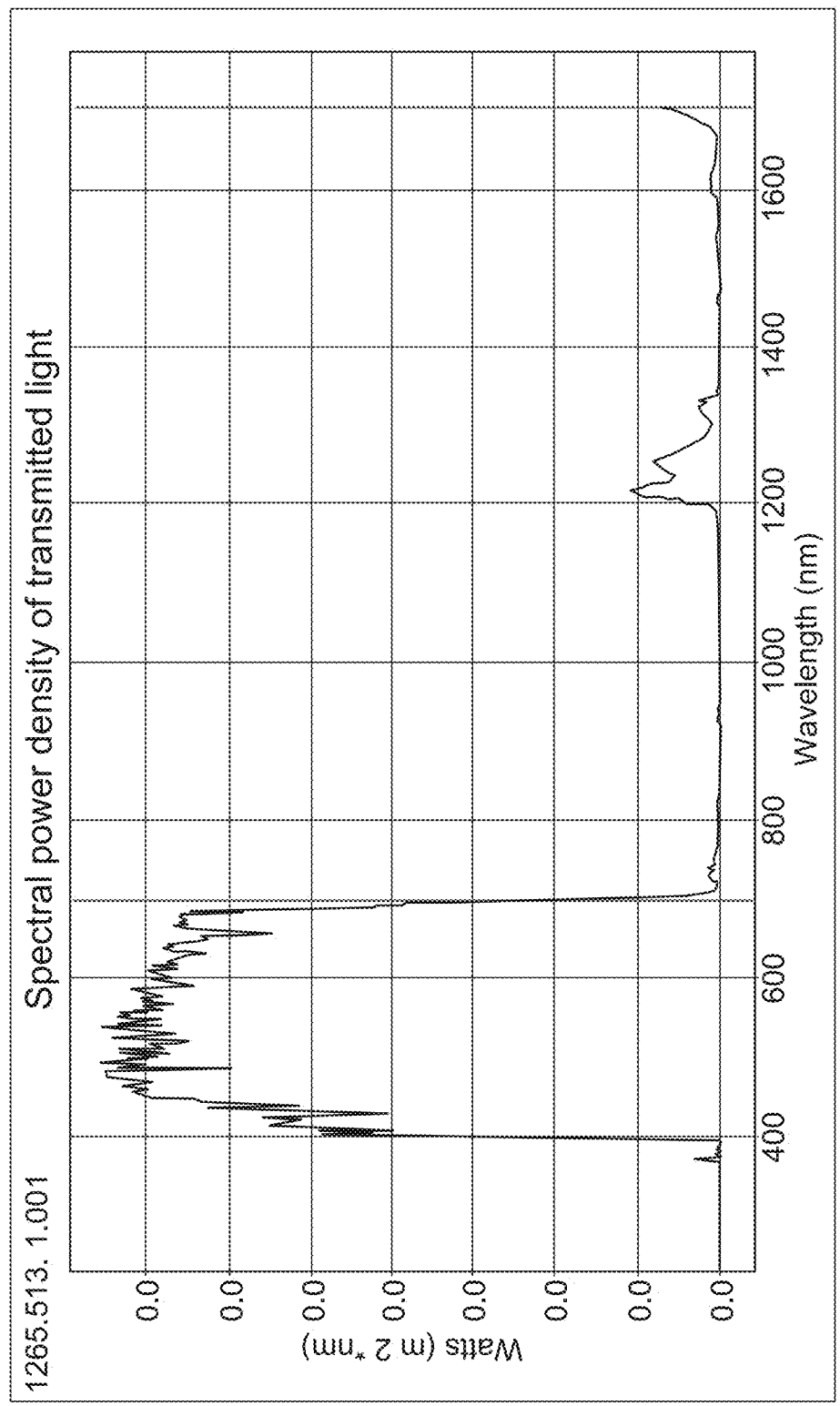
FIG. 5 shows a calculated spectral power density that relates to a spectrally selective panel in accordance with a specific embodiment of the present invention.

For quantifying the performance of the coating 110 it is assumed that a fraction of incident solar IR energy within the standard AM 1.5 solar spectrum between e.g. 700-1700 nm which is transmitted at normal incidence through a glass coated with the coating 110. A calculation of the performance of the coating 110 indicates that only 18.69 Watts/$m^2$ are transmitted, out of the total 467.85 Watts/$m^2$ incident, which is only 3.99% of the total solar IR heat energy between 700-1700 nm transmitted through glass. FIG. 5 illustrates the calculated spectral power density. The energy integration is done numerically using measured spectral data points relevant to AM 1.5, the coating response, and the Simpson's formula. 96% of the solar IR energy contained between 700-1700 nm is thus reflected off this coating in the example provided. Importantly, these figures assume normal incidence of solar light onto glass and the window intercepting all solar energy flux at a 90 degree flux angle. In reality, even less IR energy will be transmitted in real applications, due to intercepting less energy flux by vertical glass panels, as well as due to the typically larger reflectivity at larger incidence angles. Due to the broad spectral band of reflection, the IR light arriving at large angles of incidence is also reflected efficiently.

The following will summarise the design of the coating 110. The coating 110 is a multiple stack edge mirror that comprises layers of dielectric materials. Each of say 3 stacks of the layers comprises typically more than 10 layers. Layer properties may be calculated as follows using a suitable software routine and a high-performance Needle Optimization or Random Optimization, or Genetic algorithms:

$$S\{a\}(L/2HL/2)^m\{b\}(L/2HL/2)^n\{c\}(L/2HL/2)^p\{d\}(LMHML)^q$$

with S identifying the location of the substrate with respect of film sequence and L, H and M denoting the quarter-wave optical thickness layers of the corresponding materials. The design wavelength in each set of brackets is varied according to the preceding multiplication factor in the "{ }" brackets, with respect to a base design wavelength. For example for a design wavelength of 500 nm, the optical layer thicknesses in the sub-stack {2.0}(HLM)10 is calculated as being 1000 nm for all layers within that sub-stack within the "( )" brackets. Consequently, the physical thickness of each the layer "H" is 1000 nm/(4*n(H)).

The aim of the optimization algorithm is to minimise sub-stack repetition indices m, n, p, and q as well as minimise the total thickness and layer number required to achieve the desired spectral response shape for any given application. Another goal is to optimize the local (sub-stack's) individual design-wavelength multiplication factors a, b, c, and d. If desired, in any additional layers may be inserted into the sequence of layers, in between sub-stacks or any index-matching layers in order to further adjust a resultant performance and spectrum the coating 110.

An example of one embodiment of this design approach is provided in the following:

$$S\{2.11\}(L/2HL/2)^{12}\{1.64\}(L/2HL/2)^{8}\{2.85\}(L/2HL/2)^{8}\{1.4\}(LMHML)^{1}$$

Figure 6:
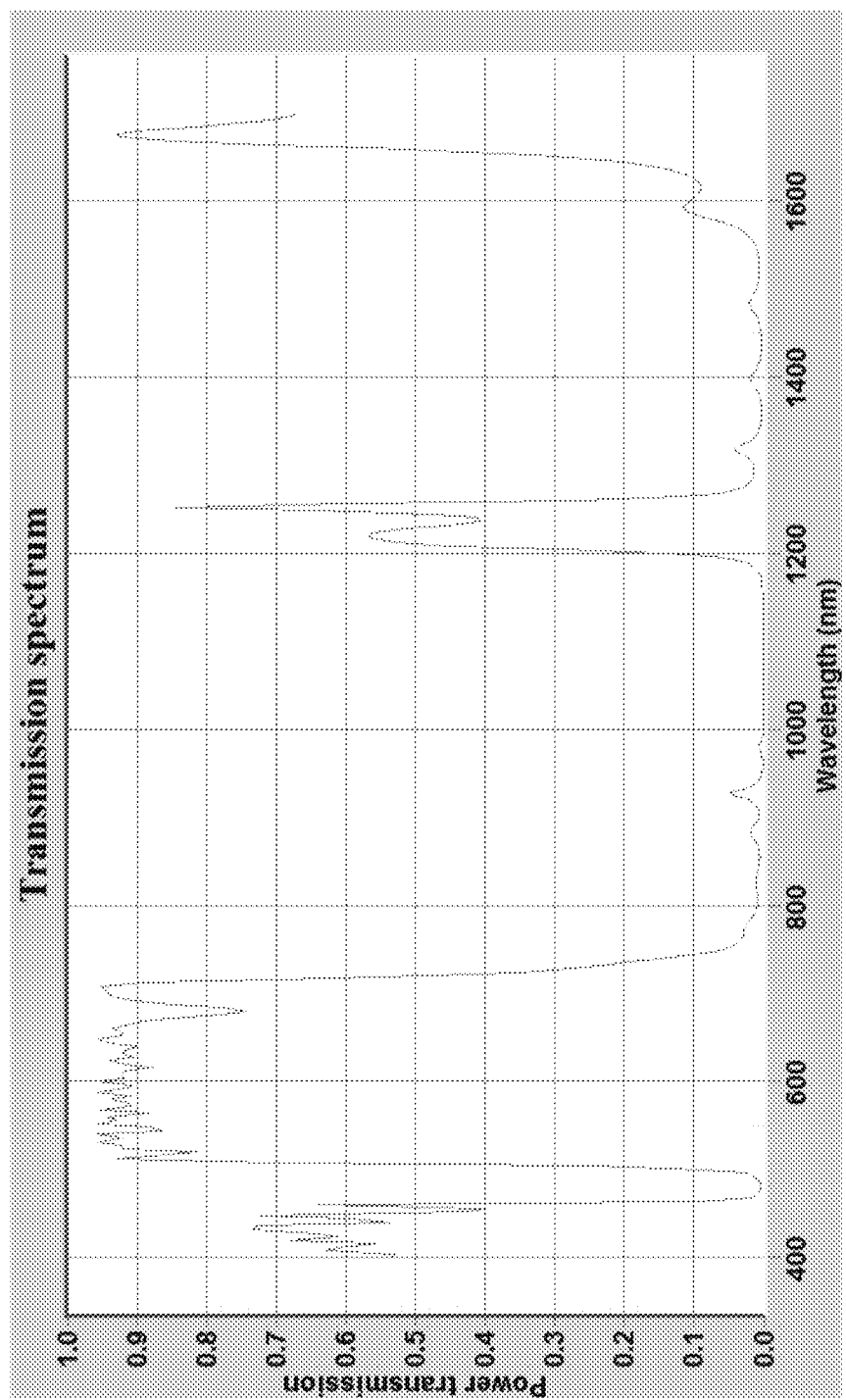
FIG. 6 shows a calculated transmission spectrum of a spectrally selective panel in accordance with a specific embodiment of the present invention.

A (base) design wavelength of 500 nm was used for the optimisation and the materials used were $Ta_2O_5$, $Al_2O_3$ and $SiO_2$. 61 layers in the deposition sequence (thickness ¼ of the wavelength of the light), total thickness of coating shown in this example is 9.4 μm. FIG. 6 shows a calculated transmission spectrum relating to this example.

Both the low-wavelength and the high-wavelength transmission slopes can be shifted spectrally and thus the slope locations can be controlled, through adjusting the design sequence and individual layer thicknesses. The high-transmission band is shifted towards the green-red region in this example, as well as a rather narrow short-wave-rejection band results from this example design.

As indicated above, the top coatings 112 and 210 are provided in the form of spectrally selective emission mirrors. The coatings 110 and 208 comprise multiple layers (20-25) of $Al_2O_3$, $SiO_2$ and $Ta_2O_5$ and are prepared using RF sputtering techniques. In this embodiment the layers 112 and 210 are designed such that especially luminescent radiation that is generated within the spectrally selective panels 100 and 200 is prevented from transmission through the coatings 102 and 210 by reflection. The thickness of such coatings varies with design requirements and is in the range of several μm.

A distinctive feature of the spectrally selective panels 100 and 200 relates to the IR-specific design of the coatings 102, 108, 110, 210, 208 and material 206 in combination with (at least partially) visibly-transparent luminophores with IR-excitable photoluminescence of material 206 and coatings 108.

In the embodiments shown in FIGS. 1 and 2 the spectrally selective panels 100 and 200 comprise scattering layers 108 and 206, respectively. It will be appreciated that in variations of the described embodiments the spectrally selective panels 100 and 200 may not comprise such scattering layers.

As mentioned above, the spectrally selective panels 100 and 200 may also comprise scattering layers. These layers were formed using RF sputtering and may comprise rare earth oxides. The scattering layers may be included, or provided instead of, the above-described layers 108 and 206. These rare earth oxide layers are prepared such that they have preferential scattering/diffusing properties in the IR wavelength range and have an amorphous surface covering (formed by an oven annealing process), which is responsible for the preferential scattering in the IR wavelength range. The preferential scattering in the IR range is related to the properties such as the characteristic particle size and inter-particle separations typical of the amorphous-oxide precipitate-like features found on the film surfaces after annealing.

The scattering layers 108 and 206 combine scattering functions, such as optically-lossless scattering, with luminescent energy-conversion functions. The layers 108 and 206 have a thickness of a few 100 nm and comprise nano- or micro-sized particles of rare earth materials (such as $Yb_2O_3$, $Nd_2O_3$) that have wide bandgaps within their electronic energy-level structures and enable essentially lossless light scattering in the IR and also visible wavelength ranges. The rare earth particles are linked by optically-transparent UV-curable epoxies (such as Norland NOA63 epoxy). Further, luminophores (pigments and nano-powdered materials) are dispersed within the epoxy material of the layers 108 and 206. In one example IR-excitable hybrid organic-inorganic luminophores are dispersed in the epoxy at a concentration of approximately around 0.25-1 wt %.

The rare earth oxides may also be doped with rare earth luminescent materials represented for example by rare-earth metal ions, and may for example be provided in the form of $Y_2O_3$:Eu, $Y_2O_3$:Er or $NaYF_4$:Yb.

Figure 3:
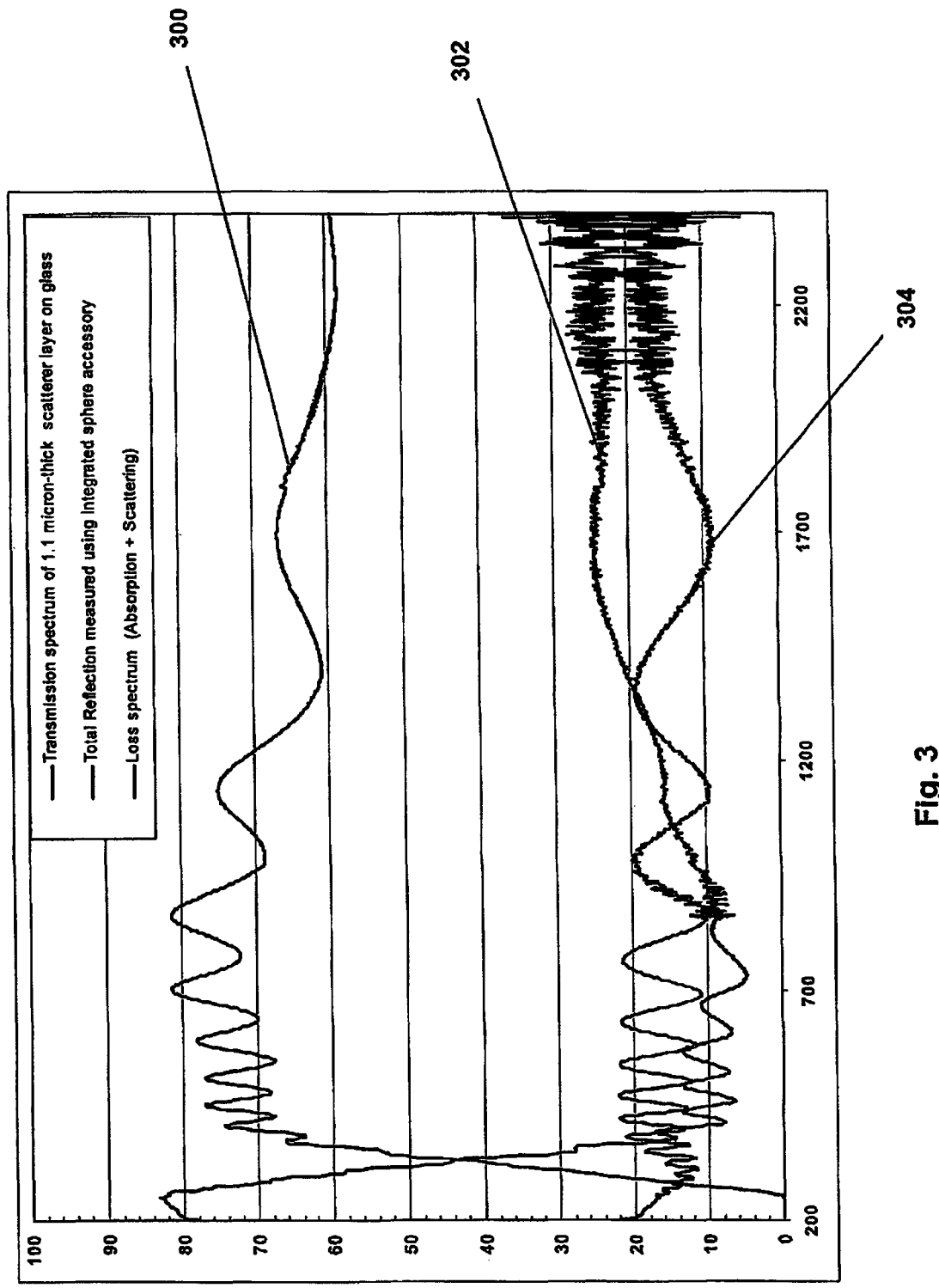
FIGS. 3 and 4 show results of measurements that were taken using components in accordance with specific embodiments of the present invention.

FIG. 3 shows transmission and absorption spectra of such a rare earth oxide layer on glass (intensity as a function of wavelength in nm). Plot 300 shows that transmission spectrum for a scatterer layer having a thickness of around 1 μm, plot 302 shows total (specular and diffused) reflection and plot 304 shows the corresponding optical-loss spectrum (represented by the sum of absorption and scattering transmission-loss and reflection-loss contributions). The layer showed preferential scattering within the IR spectral range which covered most of near IR range. The visible transparency was near 80%. After being brought into contact with an optical epoxy of refractive index close to 1.49 (matched to glass), the scattering reduces and transparency improves. This rare earth oxide scatterer layer has luminophore properties when excited by suitable light.

Figure 4:
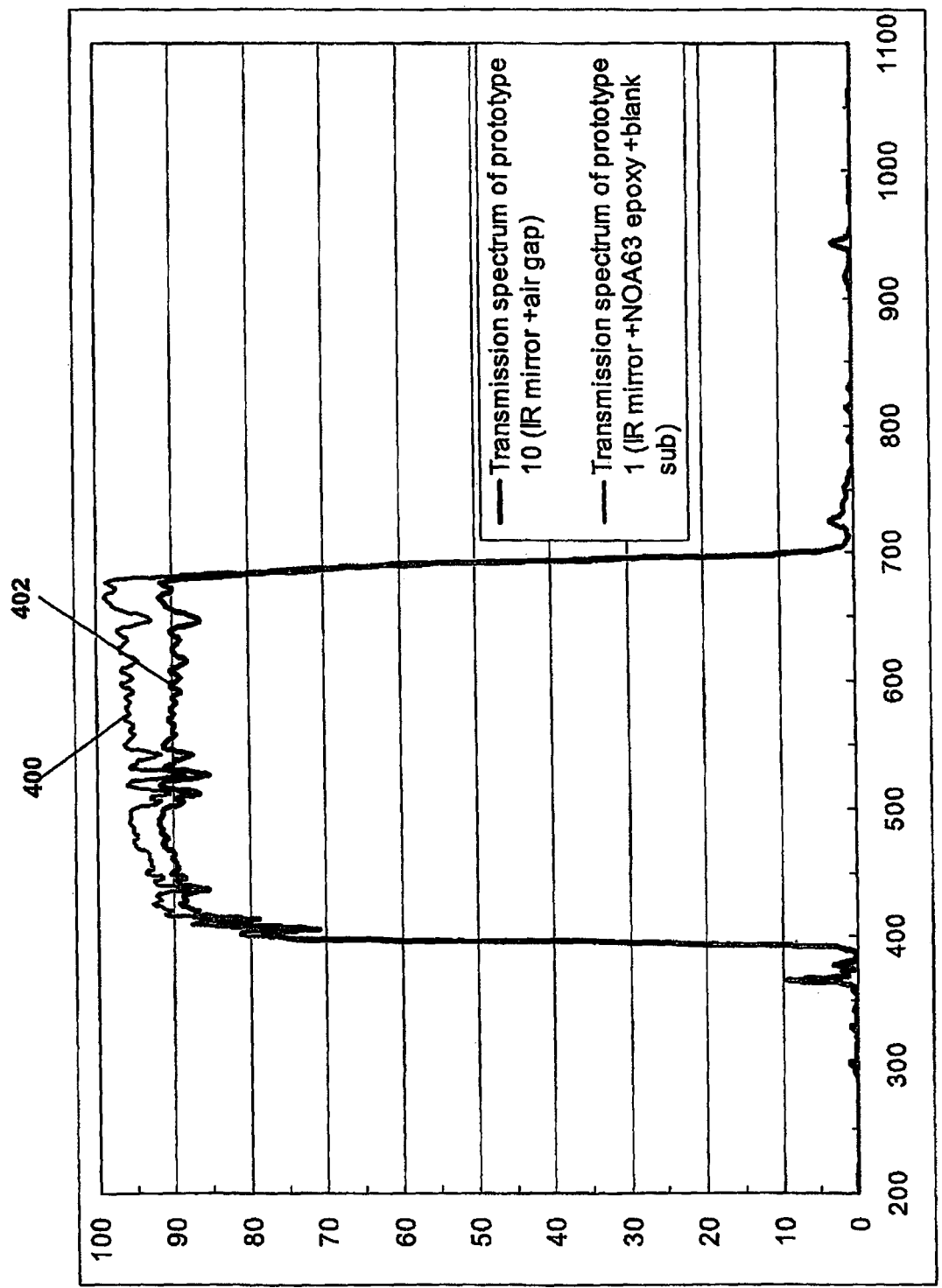

FIG. 4 shows transmission spectra for the spectrally selective panels 100 and 200 (transmitted fraction of intensity as a function of wavelength in nm). Plot 400 shows the measured transmission data for a panel of the type of the spectrally selective panel 100 (with air gap) and plot 402 shows the measured transmission data for a panel of the type of the spectrally selective panel 200 (no air gap).

It is worth noting the air gap of the panel 100 does not significantly affect the visible transmission. Further, as the epoxy is index-matched to glass, the epoxy itself does not cause any significant transmission loss.

The function of the spectrally selective panel 100 may be summarized as follows. After multiple scattering passes through scattering layers and interfaces, (statistically) more photons will propagate at angles exceeding the total internal reflection angle for light rays propagating within a glass panel surrounded by air. Considering that a large fraction of the solar IR light is incident at large angles (facilitated by scattering and emission of luminescence radiation), a large fraction of this IR light will be trapped within the spectrally selective panel 100 and will reach the side portions of the panel 100. The top coating 112 is designed to reflect the light emitted by the luminophores and is visibly transparent. The bottom coating 110 reflects the vast majority of IR light at all angles and wavelengths. These properties combined with the angular redistribution of the incoming photons by multi-pass scattering within relatively thin non-absorbing or weakly-absorbing and luminescent layers 108 is a unique feature of the spectrally selective panels 100 in accordance with embodiments of the present invention. The scattering effects are also capable of enhancing the luminescence processes by improving the luminophore absorption pathlengths.

Figure 7:
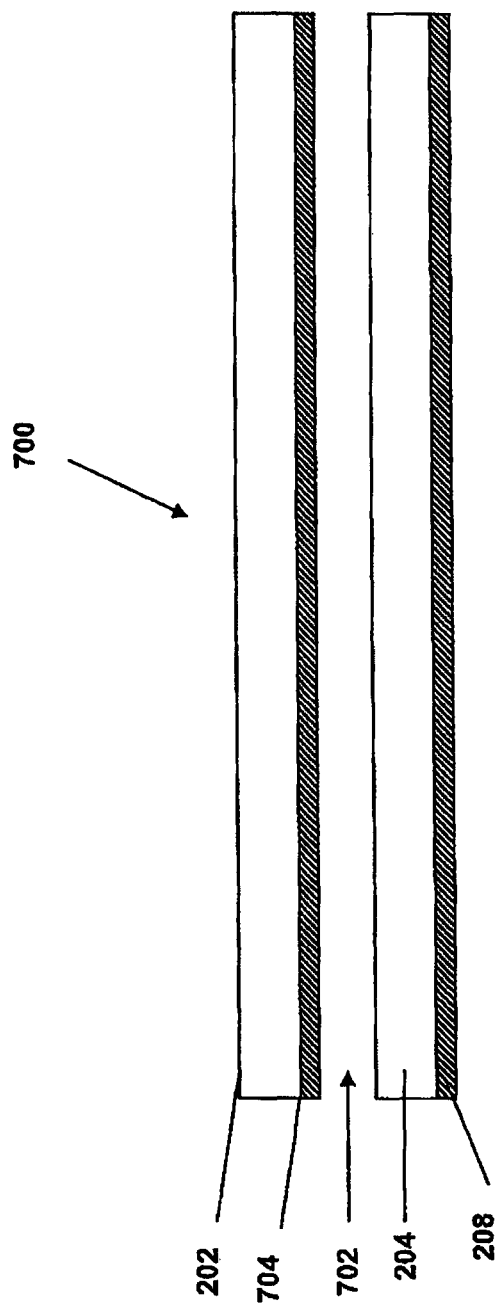
FIG. 7 is a representation of a spectrally selective panel in accordance with a another specific embodiment of a present invention.
Figure 8:
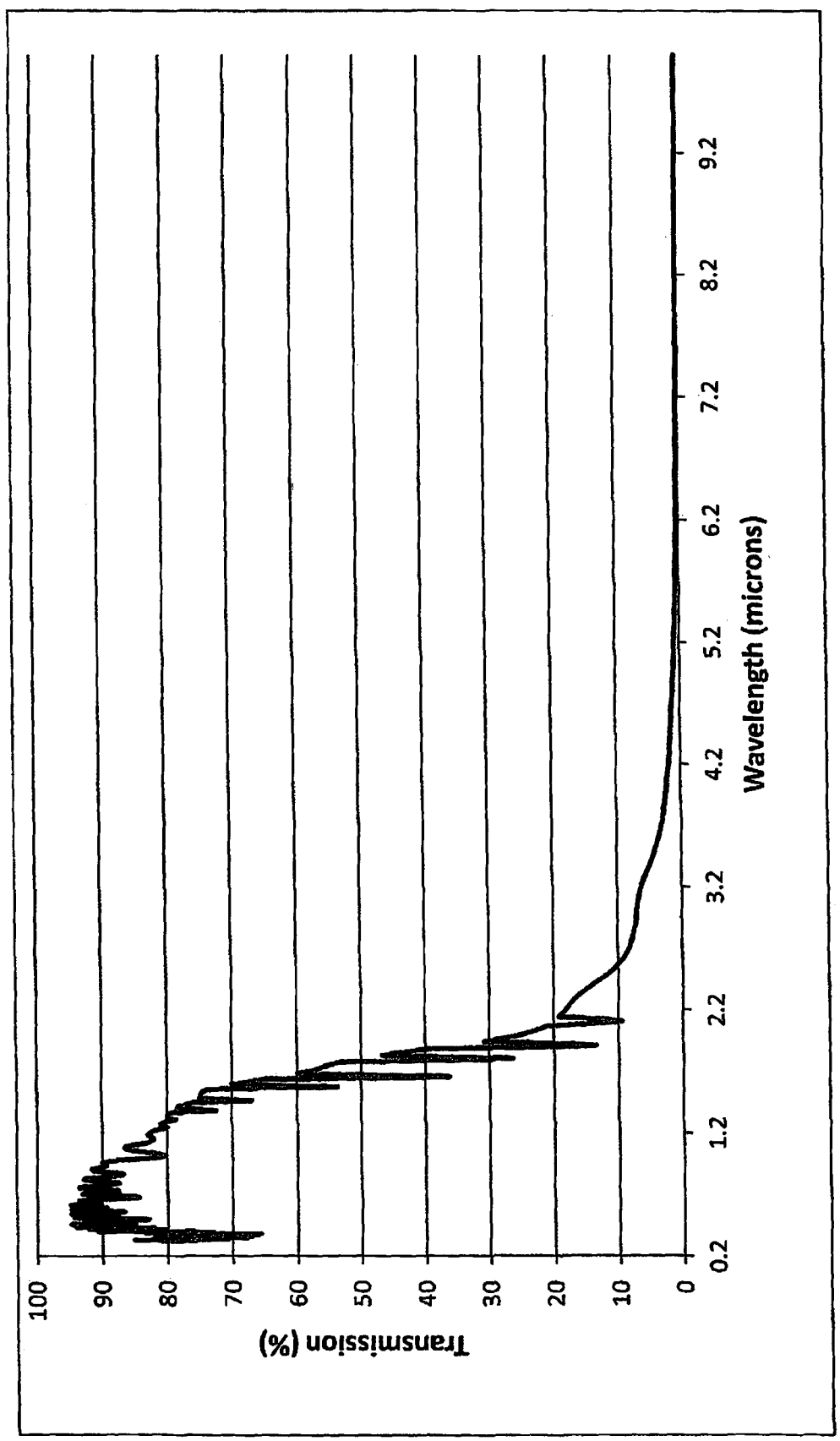
FIG. 8 shows a calculated transmission spectrum of a spectrally selective panel in accordance with a specific embodiment of the present invention.

Referring no to FIG. 7, a spectrally selective panel 700 in accordance with another embodiment of the present invention is now described. The spectrally selective panel 700 comprises the above-described panel portions 202 and 204 and the solar selective bottom coating 208. In this embodiment the panel portions 202 and 204 are spaced apart by an air gap 702. Further, the spectrally selective component 700 comprises a low thermal emission coating 704. The coating 704 has high transmission properties for visible light and relatively high reflectivity for a relatively broad IR wavelength range. FIG. 8 shows a calculated transmission spectrum of the coating 704. The spectrum of the coating 704 has in this embodiment a relatively steep slope separating high and low transmission ranges at 1500+/−100 nm. The transmission of IR radiation is reduced to below 10% or even below 1-2% in a very broad range of wavelengths typically extending from this slope to wavelengths in excess of 10 microns or even 20 microns.

For example, the spectrally selective panel 700 may form a pane of a window in a building. In this case the spectrally panel 700 typically is oriented such that the coating 208 faces towards an interior of the building. The low (thermal) emission coating 704 allows transmission of most of the visible-range and solar-IR energy from the exterior of the building, which allows harvesting of solar energy using the coating 208 in the above-described manner. At the same time, the low emission coating 704 reflects most thermal IR radiation originating from heaters and the like within the interior of the building back into the interior of the building, which reduces loss of thermal energy. The coatings 208 and 704 consequently both contribute to a reduction in energy consumption and reduce incurred cost.

In this embodiment the coating 704 comprises 11 layers that are composed of Ag and $Y_2O_3$ having thicknesses that are selected to achieve the spectral characteristics as shown in FIG. 8.

A person skilled in the art will appreciate that the coating 704 may alternatively be formed from other suitable materials and may have a different number of layers. Further, it is to be appreciated that the spectrally selective component 700 may alternatively be provided in another form. For example, the spectrally selective component 700 may comprise the above-described top coating 210. Further, the air gap 704 may be replaced with the layer 206. In addition, the low emission layer 704 may alternatively be positioned at another surface, such as a surface of the panel 204.

Although the invention has been described with reference to particular examples, it will be appreciated by those skilled in the art that the invention may be embodied in many other forms.

The invention claimed is:

1. A spectrally selective panel forming a part of a window of a building, the spectrally selective panel comprising:
a first panel portion that is at least partially transmissive for light having a wavelength in the visible wavelength range, the first panel portion comprising component panel portions that are positioned in a face-to-face relationship;
a first reflective component positioned at an outer surface of the first panel portion and being arranged to reflect incident light within an infrared (IR) wavelength band and within an ultraviolet (UV) wavelength band while being largely transmissive for at least the majority of light having a wavelength within the visible wavelength band, the first reflective component being provided in the form of an optical interference coating that comprises layers of dielectric materials that are arranged such that within a wavelength range from approximately 600 nm to approximately 800 nm the transmittance decreases from at least 60% to less than 10%, the first reflective component being arranged to reflect more than 90% of solar energy of the incident radiation at a wavelengths range of approximately 700 nm to approximately 1700 nm; and
a layer of scattering material arranged to increase scattering of incident light, the scattering material comprising a luminescent material arranged to absorb at least a portion of incident light having a wavelength in the IR wavelength band and emit light having a wavelength in the IR wavelength band by luminescence, the layer being sandwiched between, and in contact with, the component panel portions that are positioned in a face-to-face relationship;
wherein the spectrally selective panel is arranged such that at least a portion of an energy associated with IR light incident from a transversal direction of the spectrally selective panel is reflected by the first reflective component and subsequently directed along the panel towards a side portion of the panel and wherein the spectrally selective panel is arranged such that at least a portion of emitted luminescence radiation is reflected by the first reflective component; and
wherein at least one CIGS (Copper Indium Gallium Diselenide) or CIS (Copper Indium Diselenide) photovoltaic module is positioned at the side portion of the spectrally selective panel for receiving a portion of the light that is directed towards the side portion.

2. The spectrally selective panel of claim 1 wherein the first reflective component is provided in the form an optical interference coating that comprises layers of dielectric materials that are arranged such that within a wavelength range from approximately 600 nm to approximately 800 nm the transmittance decreases at from least 80% to less than 5%.

3. The spectrally selective panel of claim 1 wherein the first reflective component is a multiple stack edge mirror.

4. The spectrally selective panel of claim 1 wherein the first panel portion is provided in the form of a glass panel portion.

5. The spectrally selective panel of claim 1 wherein the first panel portion is formed from a polymeric material.

6. The spectrally selective panel of claim 1 wherein the spectrally selective panel comprises, or is provided in the form of, a windowpane.

7. The spectrally selective panel of claim 1 wherein the luminescent material comprises visibly transparent luminophores that are arranged for absorption of IR light.

8. The spectrally selective panel of claim 1 comprising the luminescent material functions as an adhesive that couples the component panel portions together in the face-to-face relationship.

9. The spectrally selective panel of claim 1 wherein the scattering material comprises at least one of a diffractive element, a phase masks and optical phase grating that result in scattering or directional deflection of incident and/or reflected light.

10. The spectrally selective panel of claim 1 comprising a top layer on which light is incident prior to transmission through the first panel portion of the spectrally selective panel and wherein the top layer is a multi-layered structure that is largely transmissive for visible light and arranged for reflecting IR light that is emitted by the luminescent material.

11. The spectrally selective panel of claim 1 wherein the spectrally selective component is arranged to reflect the transmission of more than 90% of the incident radiation within a wavelength range of approximately 300 nm to approximately 410 nm.

12. The spectrally selective panel of claim 1 wherein the spectrally selective component is arranged to reflect the transmission of more than 96% of the incident radiation at a wavelength range of approximately 300 nm to approximately 410 nm.

* * * * *